(12) United States Patent
Moore et al.

(10) Patent No.: US 9,895,714 B2
(45) Date of Patent: Feb. 20, 2018

(54) CRYSTALLINE ORGANIC-INORGANIC HALIDE PEROVSKITE THIN FILMS AND METHODS OF PREPARATION

(71) Applicant: Cornell University, Ithaca, NY (US)

(72) Inventors: David T. Moore, Ithaca, NY (US); Hiroaki Sai, Evanston, IL (US); Kwan Wee Tan, Singapore (SG); Lara A. Estroff, Dryden, NY (US); Ulrich B. Wiesner, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 58 days.

(21) Appl. No.: 15/054,988

(22) Filed: Feb. 26, 2016

(65) Prior Publication Data

US 2016/0251303 A1    Sep. 1, 2016

Related U.S. Application Data

(60) Provisional application No. 62/121,881, filed on Feb. 27, 2015.

(51) Int. Cl.
*C07C 211/63* (2006.01)
*B05D 3/00* (2006.01)

(52) U.S. Cl.
CPC ............ *B05D 3/007* (2013.01); *Y02P 20/542* (2015.11)

(58) Field of Classification Search
None
See application file for complete search history.

(56) References Cited

PUBLICATIONS

Song et al. "Impact of Processing Temperature and Composition on the Formation of Methylammonium Lead Iodide Perovskites"; Chem. Mater. 2015, 27, pp. 4612-4619.*
Suarez et al. "Recombination Study of Combined Halides (Cl, Br, I) Perovskite Solar Cells"; J. Phys. Chem. Lett. 2014, 5, pp. 1628-1635.*
Zuo et al. "Binary-Metal Perovskites Toward High-Performance Planar-Heterojunction Hybrid Solar Cells"; Adv. Mater. 2014, 26, pp. 6454-6460.*
Chen et al. "Controllable Self-Induced Passivation of Hybrid Lead Iodide Perovskites toward High Performace Solar Cells"; Nano. Lett., 2014, 14, pp. 4158-4163.*

(Continued)

*Primary Examiner* — David Sample
*Assistant Examiner* — Donald M Flores, Jr.
(74) *Attorney, Agent, or Firm* — Scully, Scott, Murphy & Presser, P.C.

(57) ABSTRACT

A film comprising a crystalline halide perovskite composition having the following formula:

$$AMX_3 \quad (1)$$

wherein: A is an organic cation selected from the group consisting of methylammonium, tetramethylammonium, formamidinium, and guanidinium; M is at least one divalent metal; and X is independently selected from halide atoms; wherein the crystalline film of the halide perovskite composition possesses at least one of an average grain size of at least 30 microns, substantial crystal orientation evidenced in an ordering parameter of at least 0.6, and a level of crystallinity of at least 90%. Methods for producing films of these halide perovskite compositions using ionic liquids instead of volatile organic solvents are also described herein.

19 Claims, 6 Drawing Sheets

(56) References Cited

PUBLICATIONS

Kutes et al. "Direct Observation of Ferroelectric Domains in Solution-Processed CH3NH3PbI3 Perovskite Thin Films"; J. Phys. Chem. Lett., 2014, 5, pp. 3335-3339.*

Saliba et al. "Influence of Thermal Processing Protocol upon the Crystallization and Photovoltaic Performane of Organic-Inorganic Lead Trihalide Perovskites"; J. Phys. Chem. C, 2014, 118, pp. 17171-17177.*

Chen, Q. et al., "Under the spotlight: The organic-inorganic hybrid halide perovskite for optoelectronic applications", Nano Today, (2015), vol. 10, pp. 355-396.

Moore, D.T. et al., "Impact of the organic halide salt on final perovskite composition for photovoltaic applications", APL Materials, (2014), vol. 2, 8 pages.

Moore, D.T. et al., "Direct Crystallization Route to Methylammonium Lead Iodide Perovskite from an Ionic Liquid", Chem. Mater., (2015), vol. 27, 10 pages.

Navas, J. et al., "New insights into organic-inorganic hybrid perovskite CH3NH3PbI3 nanoparticles. An experimental and theoretical study of doping in Pb2+ sites with Sn2+, Sr2+, Cd2+ and Ca2+", Nanoscale, (2015), vol. 7, pp. 6216-6229.

Broxmeyer, H.E. et al., "Human umbilical cord blood as a potential source of transplantable hematopoietic stem/progenitor cells", Proc. Natl. Acad. Sci. USA, (May 1989), vol. 86, pp. 3828-3832.

Tan, K.W. et al., "Thermally Induced Structural Evolution and Performance of Mesoporous Block Copolymer-Directed Alumina Perovskite Solar Cells", ACSNano, (2014), vol. 8, No. 5, 15 pages.

Zhang, W. et al., "Ultrasmooth organic-inorganic perovskite thin-film formation and crystallization for efficient planar heterojunction solar cells", Nature Communications, (Jan. 30, 2015), 19 pages.

\* cited by examiner

CRYSTALLINE ORGANIC-INORGANIC HALIDE PEROVSKITE THIN FILMS AND METHODS OF PREPARATION

CROSS REFERENCE TO RELATED APPLICATION

The present application claims benefit of U.S. Provisional Application No. 62/121,881, filed on Feb. 27, 2015, all of the contents of which are incorporated herein by reference.

GOVERNMENT SUPPORT

This invention was made with Government support under Grant Numbers DMR-1008125 and DMR-1210304 awarded by National Science Foundation. The United States Government has certain rights in the invention.

FIELD OF THE INVENTION

The present invention relates generally to organic-inorganic halide perovskite compositions, and more particularly, to crystalline film versions of such compositions, and to methods of preparing such compositions.

BACKGROUND OF THE INVENTION

Organic-inorganic halide perovskites, such as, for example, the methylammonium lead halides, i.e., $(CH_3NH_3)PbX_3$, where $CH_3NH_3$ corresponds to the methylammonium cation and X is a halide, are a broad class of photoactive materials with applications to solar energy with device efficiencies typically exceeding 20%. The class of materials, hereafter referred to as halide perovskites, are distinguished by their $AMX_3$ perovskite structure, wherein A is an organic molecule, typically methylammonium, tetramethylammonium, guanidinium, or formamidinium; M is typically tin or lead; and X is a halide, such as fluoride, chloride, iodide, or bromide.

A particular advantage of these materials is that they can be produced and processed at or near ambient conditions from solution. The facile nature of the process makes these photoactive materials relatively inexpensive to produce, which is a critical advantage when considering these materials for large-scale commercial production. In the conventional process, the precursor components are mixed in a solvent containing a volatile organic component, hereafter referred to as a VOC, and the resulting precursor solution are deposited on a substrate, followed by heating the precursor solution at a temperature sufficient to react and convert the precursor species into the perovskite composition.

However, there are several challenges and drawbacks in the VOC process, all of which result in substantial imperfections in the final perovskite film, particularly in crystallinity, grain size, and crystal orientation. These imperfections lead to non-optimal or poor device performance. Thus, proper control of the growth of the halide perovskite is critical for producing high-quality crystalline films, which would improve device performance. However, the VOC process poses significant limitations in the effort to achieve high-quality crystalline films. The VOC process is also generally hampered by incomplete coverage of the substrate, low crystallinity, and inconsistent (non-uniform) film thickness.

Generally, the conventional VOC process begins with dissolving two or more salts in a common solvent. For example, to make methylammonium lead iodide, lead chloride ($PbCl_2$) and methylammonium iodide ($CH_3NH_3^+I^-$) in a 1:3 molar ratio can be dissolved in a polar aprotic solvent, such as dimethylformamide (DMF). The resulting solution is deposited on a substrate and then heated to about 100° C. for about 45 minutes. At 100° C., films of acceptable quality generally need to be grown for at least 40 minutes but no longer than 60 minutes. Generally, longer processing times are not possible in the VOC process because the volatility of the organic solvent limits the time available for processing. For any given combination of salts in any specific solvent, the length of time is substantially limited by the time available until the solvent completely evaporates. The crystallization and growth of thin films from solution is a function of supersaturation; for the VOC process this supersaturation is due to evaporation of the solvent. The growth time available is the time between enough evaporation for supersaturation to occur and the time at which evaporation is substantially complete, after which, the perovskite film begins decomposing if the processing temperature is continued. Thus, using the VOC process, the processing time is generally fixed, which in turn hampers any effort to employ longer processing times with the precursor components remaining in solution.

In the case of $(CH_3NH_3)PbI_3$, the crystallization completes at about 45 minutes, but decomposition begins within 5-10 minutes after that if left at the processing temperature. This is the source of the challenges discussed above. Although the growth time can be altered by changes to the salt ratios, solvent mixture, and temperature, for any given combination of these three processing conditions, there will be an exact crystallization time, and thus, the length of time for which a film can be continued to be processed is very short. The stability of the films, particularly with regard to decomposition, is dramatically affected by the short time window. Moreover, slight variations in processing time result in large changes in the resulting film quality. For this reason, the VOC process results in perovskite films of inconsistent film quality.

Another problem with the VOC process is the tendency of the solvent to dewet the substrate. Dewetting of the substrate contributes to incomplete film coverage and lack of uniformity. Earlier efforts focused on tailoring the solvent-salt and/or solution-substrate interactions to limit the dewetting effect. These approaches sought to induce homogeneous nucleation using a high nucleation density. The higher density of the crystal nuclei was expected to allow the crystal grains to grow to impingement before the solvent evaporation was substantially complete, which would improve substrate coverage. However, the nucleation density also determines the maximum grain size; i.e., if the nuclei are spaced 500 nm apart, then the grains can only grow to 500 nm before they impinge on each other and grain growth stops.

In addition to the above concerns, there is the problem of a solid-state intermediate phase that occurs in the VOC process. The existence of this intermediate defines the perovskite growth as a solid-state transformation. The solid-state transformation makes the process even more challenging since rearranging atoms and molecules becomes significantly more difficult in the solid state than in solution.

Lastly, the VOC process generates byproducts, such as unreacted reagent salts and solvent vapor, that are generally not recoverable. Particularly when considering commercial scale production, such byproduct formation amounts to significant waste and financial losses.

SUMMARY OF THE INVENTION

The invention is directed, in one aspect, to films containing a crystalline halide perovskite composition having the following formula:

$$AMX_3 \qquad (1)$$

wherein A is an organic cation selected from methylammonium, tetramethylammonium, formamidinium, and guanidinium; M is at least one divalent metal; and X is independently selected from halide atoms; wherein the crystalline film of the halide perovskite composition possesses at least one of: an average grain size of at least 30 microns, substantial crystal orientation evidenced in an ordering parameter of at least 0.6, and a level of crystallinity of at least 90%.

In another aspect, the invention is directed to a method for producing the above-described film of a crystalline halide perovskite composition. The method includes:
i) forming a film of a perovskite precursor solution onto a substrate, the perovskite precursor solution containing: a) a metal-containing compound of the formula $MX'_2$, wherein M is at least one divalent metal and X' is a monovalent anion; b) an organic salt of the formula AX, wherein A is selected from methylammonium, tetramethylammonium, formamidinium, and guanidinium, and X is independently selected from halide atoms; and c) an ionic liquid; wherein components a) and b) are dissolved in component c); and
ii) annealing the film of the perovskite precursor solution at a temperature of at least 30° C. for a time period effective to convert perovskite precursor components in the perovskite precursor solution to a film of a crystalline halide perovskite composition within the scope of Formula (1) above.

The inventive process described herein is advantageously a direct one-step process that produces the final perovskite composition without proceeding through an intermediate, in contrast to the conventional VOC process which proceeds through an uncharacterized intermediate. By virtue of the extremely low vapor pressure and resulting non-volatility of an ionic liquid, even at elevated temperatures, the inventive process can be practiced without the significant limitations in temperature and processing time well known in the VOC process. As supersaturation is not caused by evaporation in the current process, and the ionic liquid is non-volatile, the precursor species can be reacted and converted over a range of elevated temperatures and over substantially longer timeframes than the VOC process. With processing time no longer limited, the one-step process advantageously permits long-term gradual crystal growth at a temperature of interest without the concern of decomposition due to solvent evaporation. The freedom in processing time permits improvements in crystallinity, grain size, and crystal orientation, as well as a significant improvement in batch-to-batch consistency in such crystal properties. Thus, the direct process described herein, based on ionic liquids instead of VOC solvents, can advantageously achieve crystalline perovskite films of significantly greater quality and with resultant improved photovoltaic properties. Lastly, unlike the VOC process, the direct process based on ionic liquids can be practiced without producing any discernible byproducts, and moreover, the ionic liquid can be easily removed, if desired, by rinsing instead of evaporation, and then recovered and re-used.

BRIEF DESCRIPTION OF THE FIGURES

FIG. 1A: Integrated 1D plots for films cast using methylammonium formate as the solvent as a function of time after film spin-coating (t=0 minutes is the end of the spin cycle), where black stick markers represent the known peak locations for $(CH_3NH_3)PbI_3$. FIG. 1B: 2D WAXS image of the same film taken at t=10 minutes showing the film texture (top) and azimuthally integrated 1D plot of the (110) reflection after background subtraction showing the calculated ordering parameter of 0.95 (bottom). FIG. 1C: Analogous to FIG. 1B except film was cast from dimethylformamide (DMF) solvent for reference: 2D WAXS image showing lack of film texture (top) and 1D plot showing the calculated ordering parameter of 0.24 (bottom). Note: the white horizontal band in FIG. 1B (top) and FIG. 1C (top) is the x-ray detector seam and is a limitation of the experimental apparatus.

FIG. 2A: X-ray diffraction (XRD) plots for several annealing profiles varying in temperature and time for films cast from methylammonium formate. Times and temperatures used are marked on each trace. Black tick markers indicate known peak locations for $(CH_3NH_3)PbI_3$. FIG. 2B: Scanning electron microscope (SEM) micrographs of a film of $(CH_3NH_3)PbI_3$ cast from methylammonium formate and produced by annealing at 75° C. for 16 hours; cross-section (top) and plan (bottom) views.

DETAILED DESCRIPTION OF THE INVENTION

Figure 1A:
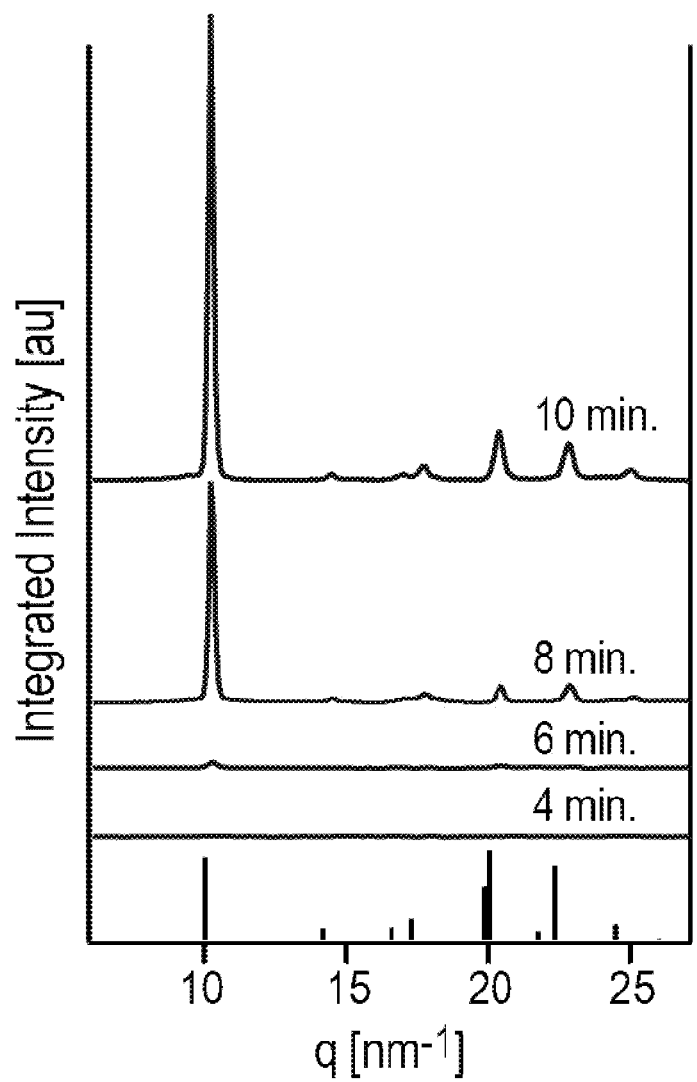
FIGS. 1A, 1B, 1C. In situ wide angle x-ray scattering (WAXS) data for films prepared from a 1:1 molar ratio of  $PbI_2$:$(CH_3NH_3^+I^-)$ annealed under nitrogen atmosphere.

In one aspect, the invention is directed to a crystalline film having a halide perovskite composition. The term "crystalline," as used herein, generally refers to a polycrystalline structure, although a single-crystal structure is also considered herein. As well known in the art, a polycrystalline material possesses crystal grains, which can be characterized as having an average grain size. Particularly in the case of photovoltaic and other photoactive materials, a larger grain size is desirable since it generally provides improved photoelectric or photocatalytic properties. The conventional VOC process is known to produce halide perovskite films with an average grain size generally no greater than 10 microns (10 μm). In contrast, the process described herein using ionic liquids instead of VOC solvents is generally capable of achieving an average grain size of at least or above 30 μm. In different embodiments, the process described herein produces a perovskite polycrystalline film having an average grain size of about, at least, or above 30 μm, 40 μm, 50 μm, 60 μm, 70 μm, 80 μm, 90 μm, 100 μm, 120 μm, 150 μm, 180 μm, 200 μm, 220 μm, 250 μm, 280 μm, or 300 μm, or an average grain size within a range bounded by any two of the foregoing exemplary values. The term "about," as used herein, generally indicates a deviation of no more than 10%, 5%, or 1% from a given value. Thus, the term "about 100 μm" may indicate, within its broadest interpretation, a value in the range of 90-110 μm.

The crystalline film may alternatively or in addition be characterized by its level of crystal orientation, which may be quantified by the ordering parameter. As used herein, the term "ordering parameter" refers to the ratio of the majority crystal orientation over all crystal orientations. As a film becomes completely amorphous, the ordering parameter approaches zero (0). On the other end of the spectrum, as the film approaches a single-crystal structure, the ordering parameter approaches one (1). The process described herein is generally capable of achieving an ordering parameter of at least or above 0.6, 0.65, 0.7, 0.75, 0.8, 0.85, or 0.9.

The crystalline film may alternatively or in addition be characterized by its level of crystallinity, which can be quantified as the ratio of the volume of the film having a crystalline structure over the total volume of the film. The process described herein is generally capable of achieving a level of crystallinity of at least or above 90%, 92%, 95%, 97%, or 99%, or even 100%.

The crystalline film described herein has a halide perovskite composition according to the following formula:

$$AMX_3 \quad (1)$$

In the above Formula (1), A is an organic cation selected from one or a combination of two or more of methylammonium ($CH_3NH_3^+$), tetramethylammonium (($CH_3)_4N^+$), formamidinium ($H_2N=CH-NH_2^+$), and guanidinium ($H_2N=C-(NH_2)_2^+$) organic cations. In some embodiments, the organic cation A may or may not be partially substituted (i.e., typically up to or less than about 1, 5, 10, or 20 mol %) with a monovalent metal ion, such as an alkali metal, such as cesium ($Cs^+$). In other embodiments, the perovskite crystal structure may be doped (e.g., by partial substitution of the organic cation A and/or the metal M) with a doping element, which may be, for example, an alkali metal (e.g., $Li^+$, $Na^+$, $K^+$, $Rb^+$, or $Cs^+$), an alkaline earth metal (e.g., $Mg^{+2}$, $Ca^{+2}$, or $Sr^{+2}$) or other divalent metal, such as provided below for M, but different from M (e.g., $Sn^{+2}$, $Zn^{+2}$, or $Cd^{+2}$), or a Group 14 element, such as Sb, Ge, or Bi, typically in an amount of up to or less than about 1, 5, 10, or 20 mol % of the organic cation A or metal M. The variable M is at least one divalent ($M^{+2}$) metal atom. The divalent metal (M) can be, for example, one or more divalent elements from Group 14 of the Periodic Table (e.g., divalent lead, tin, or germanium), one or more divalent transition metal elements from Groups 3-12 of the Periodic Table (e.g., divalent titanium, vanadium, chromium, manganese, iron, cobalt, nickel, copper, zinc, palladium, platinum, and cadmium), and/or one or more divalent alkaline earth elements (e.g., divalent magnesium, calcium, strontium, and barium). The variable X is independently selected from one or a combination of halide atoms, wherein the halide atom (X) may be, for example, fluoride ($F^-$), chloride ($Cl^-$), bromide ($Br^-$), and/or iodide ($I^-$).

The crystalline perovskite film described herein can have any suitable film thickness, but more typically has a film thickness of at least 200 nm. In different embodiments, the perovskite film has a film thickness of about, at least, above, up to, or less than, for example, 200 nm, 300 nm, 400 nm, 500 nm, 1000 nm (1 μm), 2 μm, 3 μm, 4 μm, 5 μm, 6 μm, 7 μm, 8 μm, 9 μm, or 10 μm.

In another aspect, the invention is directed to a method for producing the above-described organic-inorganic halide perovskite film. In the method, a perovskite precursor solution (i.e., "precursor solution") is deposited onto a substrate as a film, and the film of precursor solution is annealed at a temperature of at least 30° C. for a time period effective to convert the precursor solution to a film of a crystalline halide perovskite composition having the composition of Formula (1), as discussed above.

The precursor solution includes: a) a metal-containing compound of the formula $MX'_2$, where M is at least one divalent metal, as described above, and X' is a monovalent anion; b) an organic salt of the formula AX, wherein A is selected from methylammonium, tetramethylammonium, formamidinium, and guanidinium, and X is independently selected from halide atoms; and c) an ionic liquid. In the precursor solution, components a) and b) are completely dissolved in component c), the ionic liquid.

In the metal-containing species $MX'_2$, the anionic species X' can be any anionic species, including halide species X. In the event the anionic species X' is not a halide species, the anionic species X' is any anionic species capable of being replaced with a halide species under the annealing conditions used in the method. Some examples of anionic species X', other than halide species, include formate, acetate, propionate, carbonate, nitrate, sulfate, thiosulfate, oxalate, triflate, cyanate, thiocyanate, acetylacetonate, and 2-ethylhexanoate. Some examples of metal-containing species $MX'_2$ include lead(II) fluoride, lead(II) chloride, lead(II) bromide, lead(II) iodide, lead(II) acetate, lead(II) carbonate, lead(II) nitrate, lead(II) sulfate, lead(II) oxalate, lead(II) triflate, lead(II) thiocyanate, lead(II) acetylacetonate, lead (II) 2-ethylhexanoate, tin(II) fluoride, tin(II) chloride, tin(II) bromide, tin(II) iodide, tin(II) acetate, tin(II) carbonate, tin(II) nitrate, tin(II) sulfate, tin(II) oxalate, tin(II) triflate, tin(II) thiocyanate, tin(II) acetylacetonate, tin(II) 2-ethylhexanoate, germanium(II) chloride, germanium(II) bromide, germanium (II) iodide, titanium(II) chloride, titanium(II) bromide, titanium(II) iodide, titanium(II) acetate, magnesium fluoride, magnesium chloride, magnesium bromide, magnesium iodide, magnesium acetate, magnesium sulfate, calcium fluoride, calcium chloride, calcium bromide, calcium iodide, calcium acetate, and calcium sulfate.

In the organic salt of the formula AX, the cation species A is selected from methylammonium, tetramethylammonium, formamidinium, and guanidinium, and X is a halide atom. Some examples of organic salts AX include methylammonium fluoride, methylammonium chloride, methylammonium bromide, methylammonium iodide, tetramethylammonium fluoride, tetramethylammonium chloride, tetramethylammonium bromide, tetramethylammonium iodide, formamidinium chloride, formamidinium bromide, formamidinium iodide, guanidinium fluoride, guanidinium chloride, guanidinium bromide, and guanidinium iodide.

In the precursor solution, $MX'_2$ and AX in the precursor are generally present in such relative amount that provides a molar ratio of M:X of about 1:3. In the case where X' is a halide (X), which corresponds with $MX'_2$ being $MX_2$, then a M:X molar ratio of about 1:3 can be provided by a 1:1 molar ratio of $MX_2$:AX. In the case where X' is non-halide (e.g., acetate), then a M:X molar ratio of about 1:3 can be provided by a 1:3 molar ratio of $MX'_2$:AX.

The term "ionic liquid," as used herein, refers to any of the widely known ionic compounds that behave as liquids below 100° C., and more typically, at or near room temperature (e.g., 15, 20, 25, 30, 35, 40, 45, or 50° C.) without being dissolved in another solvent. The ionic liquid can be conveniently described by the formula $Y^+W^-$, wherein $Y^+$ is a cationic component of the ionic liquid and $W^-$ is an anionic component (counterion) of the ionic liquid, which can be any of the counterions well known in the art and as provided above, as long as the combination of $Y^+$ and $W^-$ result in an ionic liquid. In the formula $Y^+W^-$, the cationic component ($Y^+$) can have any valency of positive charge, and the anionic component ($W^-$) can have any valency of negative charge, provided that the charge contributions from the cationic and anionic portions are counterbalanced to ensure charge neutrality. Thus, the ionic liquid can be more generically described by the formula $(Y^{+a})_y(W^{-b})_x$, wherein the variables a and b are, independently, non-zero integers, and the subscript variables x and y are, independently, non-zero integers, such that a.y=b.x. The foregoing generic formula encompasses numerous possible sub-formulas, such as, for example, $(Y^+)(W^-)$, $(Y^{+2})(W^-)_2$, $(Y^+)_2(W^{-2})$, $(Y^{+2})_2(W^{-2})_2$, $(Y^{+3})(W^-)_3$, $(Y^+)_3(W^{-3})$, $(Y^{+3})_2(W^{-2})_3$, and $(Y^{+2})_3(W^{-3})_2$.

The ionic liquid contains a cation $(Y^+)$ that may be the same or different than the cation (A) in the organic salt. In some embodiments, the ionic liquid contains a cation $(Y^+)$ selected from methylammonium, tetramethylammonium, formamidinium, and guanidinium anionic species, as provided for the cation (A) in the organic salt, and which may be the same or different than the cation (A) in the organic salt. In the case where the cation $(Y^+)$ in the ionic liquid is selected from methylammonium, tetramethylammonium, formamidinium, and guanidinium anionic species, and is different than the cation (A) in the organic salt, the cation $(Y^+)$ in the ionic liquid is capable of exchanging with the cation (A) in the organic salt during the annealing process. Thus, in the latter embodiment, the cation (A) in the produced perovskite composition according to Formula (1) may be a mixture of two cationic species selected from methylammonium, tetramethylammonium, formamidinium, and guanidinium depending on the level of cation exchange between the organic salt and ionic liquid. In the event that the ionic liquid includes a cation $(Y^+)$ that is not selected from methylammonium, tetramethylammonium, formamidinium, and guanidinium (e.g., $Y^+$ being dimethylammonium, trimethylammonium, ethylammonium, or an N-alkyl formamidinium or guanidinium derivative), exchange is not expected to occur between the cation (A) in the organic salt and $Y^+$ of the ionic liquid during the annealing process since $Y^+$ in this case would not be expected to fit into the perovskite structure according to Formula (1). A particular benefit of using an ionic liquid having a cation equivalent to the cation in the organic salt is that the diffusion of the cation out of the perovskite can be suppressed by Le Chatelier's principle, thereby further minimizing decomposition.

The anion $(W^-)$ of the ionic liquid is any counterion which, when associated with a cationic component $(Y^+)$, permits the resulting ionic compound to behave as an ionic liquid. As known in the art, the composition and structure of the counteranion strongly affects the properties (e.g., melting point, volatility, stability, viscosity, hydrophobicity, and so on) of the ionic liquid.

In one embodiment, the anion of the ionic liquid is inorganic. Some examples of such anions include fluoride, chloride, bromide, iodide, hexachlorophosphate ($PCl_6^-$), bifluoride ($HF_2^-$), hexafluorophosphate ($PF_6^-$), fluorophosphate ($PO_3F^{2-}$), tetrafluoroborate ($BF_4^-$), aluminum fluorides (e.g., $AlF_4^-$), hexafluoroarsenate ($AsF_6^-$), hexafluoroantimonate ($SbF_6^-$), perchlorate, chlorate, chlorite, cyanate, isocyanate, thiocyanate, isothiocyanate, perbromate, bromate, bromite, periodate, iodate, carbonate, bicarbonate, dicyanamide (i.e., $N(CN)_2^-$), tricyanamide (i.e., $N(CN)_3^-$), aluminum chlorides (e.g., $Al_2Cl_7^-$ and $AlCl_4^-$), aluminum bromides (e.g., $AlBr_4^-$), nitrate, nitrite, sulfate, sulfite, hydrogensulfate, hydrogensulfite, phosphate, hydrogenphosphate ($HPO_4^{2-}$), dihydrogenphosphate ($H_2PO_4^-$), phosphite, arsenate, antimonate, selenate, tellurate, tungstate, molybdate, chromate, silicate, the borates (e.g., borate, diborate, triborate, tetraborate), anionic borane and carborane clusters (e.g., $B_{10}H_{10}^{2-}$ and $B_{12}H_{12}^{2-}$), perrhenate, permanganate, ruthenate, perruthenate, and the polyoxometallates. In some embodiments, any one or more classes or specific types of inorganic anions described above are excluded from the ionic liquid. For example, in some embodiments, the ionic liquid possesses an anion other than a halide species.

In another embodiment, the anion of the ionic liquid is organic by including carbon and at least one carbon-hydrogen or carbon-fluorine bond. Some examples of such anions include the carboxylates (e.g., formate, acetate, propionate, butyrate, valerate, lactate, pyruvate, oxalate, malonate, glutarate, adipate, decanoate, salicylate, ibuprofenate, and the like), the sulfonates (e.g., $CH_3SO_3^-$, $CH_3CH_2SO_3^-$, $CH_3(CH_2)_2SO_3^-$, benzenesulfonate, toluenesulfonate, dodecylbenzenesulfonate, docusate, and the like), the alkoxides (e.g., methoxide, ethoxide, isopropoxide, phenoxide, and glycolate), the amides (e.g., dimethylamide and diisopropylamide), diketonates (e.g., acetylacetonate), the organoborates (e.g., $BR_1R_2R_3R_4^-$, wherein $R_1$, $R_2$, $R_3$, $R_4$ are typically hydrocarbon groups containing 1 to 6 carbon atoms), the alkylsulfates (e.g., diethylsulfate), alkylphosphates (e.g., ethylphosphate or diethylphosphate), the phosphinates (e.g., bis-(2,4,4-trimethylpentyl)phosphinate), the fluorosulfonates (e.g., $CF_3SO_3^-$, $CF_3CF_2SO_3^-$, $CF_3(CF_2)_2SO_3^-$, $CHF_2CF_2SO_3^-$, and the like), the fluoroalkoxides (e.g., $CF_3O^-$, $CF_3CH_2O^-$, $CF_3CF_2O^-$, and pentafluorophenolate), the fluorocarboxylates (e.g., trifluoroacetate and pentafluoropropionate), and the fluorosulfonylimides (e.g., $(CF_3SO_2)_2N^-$). In some embodiments, any one or more classes or specific types of organic anions described above are excluded from the ionic liquid.

In a particular set of embodiments, the ionic liquid is an alkylammonium ionic liquid. The alkylammonium ionic liquids are well known in the art, as evidenced by, for example, M. Anouti et al., *J. Phys. Chem. B*, 112, 31, pp. 9406-9411 (2008) and Greaves et al., *J. Phys. Chem. B*, 112, 3, pp. 896-905 (2008), the contents of which are herein incorporated by reference in their entirety. The cationic component of the alkylammonium ionic liquid may be, for example, methylammonium, dimethylammonium, trimethylammonium, tetramethylammonium, ethylammonium, diethylammonium, triethylammonium, tetraethylammonium, ethyltrimethylammonium, diethyldimethylammonium, triethylmethylammonium, n-propylammonium, n-propyltrimethylammonium, isopropylammonium, n-butylammonium, n-butyltrimethylammonium, n-butylmethylammonium, di-(n-butyl)dimethylammonium, tri-(n-butyl)methylammonium, n-pentylammonium, n-pentyltrimethylammonium, tri-(n-pentyl)methylammonium, n-hexylammonium, n-hexyltrimethylammonium, tri-(n-hexyl)methylammonium, n-heptylammonium, n-heptyltrimethylammonium, tri-(n-heptyl)methylammonium, n-octylammonium, n-octyltrimethylammonium, tri-(n-octyl)methylammonium, benzyltrimethylammonium, choline, 2-hydroxyethylammonium, and allylammonium. In some embodiments, any one or more cationic species described above are excluded from the ionic liquid.

In some embodiments, the cationic component $(Y^+)$ of the ionic liquid contains a positively-charged heterocyclic ring. Such ionic liquids are well known in the art. In a first embodiment, the positively-charged heterocyclic ring includes a positively-charged ring nitrogen atom. The heterocyclic ring having a positively-charged ring nitrogen atom can be monocyclic, bicyclic, tricyclic, or a higher cyclic (polycyclic) ring system. Some examples of a heterocyclic ring having a positively-charged ring nitrogen atom include imidazolium, pyridinium, pyrazinium, pyrrolidinium, piperidinium, piperazinium, morpholinium, pyrrolium, pyrazolium, pyrimidinium, triazolium, oxazolium, thiazolium, triazinium, and cyclic guanidinium rings. In some embodiments, the cationic component $(Y^+)$ of the ionic liquid is not a heterocyclic species, or any one or more of the above heterocyclic rings may be excluded from the ionic liquid.

In some embodiments, the cationic component ($Y^+$) of the ionic liquid is a phosphonium or sulfonium species. Such ionic liquids are also well known in the art. Some examples of phosphonium species include tetramethylphosphonium, tetraethylphosphonium, tetrapropylphosphonium, tetrabutylphosphonium, tetrapentylphosphonium, tetrahexylphosphonium, tetraheptylphosphonium, tetraoctylphosphonium, tetraphenylphosphonium, ethyltrimethylphosphonium, and dibutyldimethylphosphonium. Some examples of sulfonium species include trimethylsulfonium, dimethylethylsulfonium, diethylmethylsulfonium, triethylsulfonium, dimethylpropylsulfonium, dipropylmethylsulfonium, tripropylsulfonium, dimethylbutylsulfonium, dibutylmethylsulfonium, and tributylsulfonium.

Generally, the ionic liquid used in the process described herein is used in the substantial or complete absence of a non-ionic liquid, wherein a non-ionic liquid is also referred to herein as a VOC solvent (relative to an ionic liquid). The non-ionic liquid being excluded includes any of the organic or inorganic non-ionic solvents known in the art, all of which are known to be significantly more volatile than an ionic liquid. Some examples of organic solvents that may be excluded from the instant process include dimethylformamide, dimethylsulfoxide, acetonitrile, propionitrile, acetone, ethylacetate, methylene chloride, chloroform, methanol, ethanol, isopropanol, ethylene glycol, diethyl ether, glyme, diglyme, propylene carbonate, N-methyl-2-pyrrolidinone, gamma-butyrolactone, tetrahydrofuran, benzene, toluene, decalin, and hexamethylphosphoramide. Some examples of inorganic solvents that may be excluded from the instant process include water, carbon disulfide, supercritical carbon dioxide, carbon tetrachloride, and sulfuryl chloride fluoride. By being excluded from the instant process, the volatile solvent is excluded at least through the complete conversion of precursor components to the crystalline halide perovskite film. Thereafter, a volatile (non-ionic) solvent may or may not be used for further processing, such as for removing the ionic liquid from the perovskite film.

The precursor solution containing the above components (i.e., metal-containing compound $MX'_2$, organic salt AX, and ionic liquid) is deposited onto a substrate as a precursor film. The precursor solution can be deposited by any of the processes well known in the art for depositing liquid films. Some examples of film deposition processes include spin-coating, drag-coating, spray-coating, and dip-coating. The substrate on which the precursor solution is placed can be any useful substrate known in the art, including functional substrates and sacrificial substrates. The substrate can be any substrate that is non-reactive with the precursor components, is suitably robust to withstand the elevated temperature of the annealing step, and is suitable for integration into a photoactive device. The choice of functional substrate is dependent on the end-use application. In some embodiments, the substrate is inorganic, such as, for example, silicon (Si), a metal (e.g., Al, Co, Ni, Cu, Ti, Zn, Pt, Au, Ru, Mo, W, Ta, or Rh, stainless steel, a metal alloy, or combination thereof), a metal oxide (e.g., glass or a ceramic material, such as F-doped indium tin oxide), a metal nitride (e.g., TaN), a metal carbide, a metal silicide, or a metal boride. In other embodiments, the substrate is organic, such as a rigid or flexible heat-resistant plastic or polymer film, or a combination thereof, or multilayer composite thereof. Some of these substrates, such as molybdenum-coated glass and flexible plastic or polymeric film, are particularly suitable for use in photovoltaic applications. The photovoltaic substrate can be, for example, an absorber layer, emitter layer, or transmitter layer useful in a photovoltaic device. The substrate may be porous or non-porous depending on the end use of the perovskite film.

After depositing the precursor solution as a film on a substrate, the precursor film (while on the substrate) is subjected to an annealing step. The film of the perovskite precursor solution is annealed at a temperature of at least or above 30° C. for a time period effective to convert the perovskite precursor components in the perovskite precursor solution to a film of a crystalline halide perovskite within the scope of Formula (1) above. In different embodiments, the annealing step employs a temperature of about, at least, above, up to, or less than 40° C., 50° C., 60° C., 70° C., 80° C., 90° C., 100° C., 110° C., 120° C., 130° C., 140° C., 150° C., 160° C., 170° C., 180° C., 190° C., or 200° C., or a temperature within a range bounded by any two of the foregoing values. As discussed above, unlike conventional processes using volatile solvents, the instant process using ionic liquids permits the use of a much wider range of temperatures, with the maximum temperature primarily limited by the boiling point or decomposition temperature of the ionic liquid and the decomposition temperature of the halide perovskite. In various embodiments, the annealing step of the present invention may employ a temperature in the range of, for example, 30-200° C., 30-180° C., 30-150° C., 30-140° C., 30-130° C., 30-120° C., 30-110° C., or 30-100° C.

As the ionic liquid is substantially non-volatile, even at elevated temperatures, the annealing process described herein may subject the precursor film to an elevated temperature, such as any of the temperatures provided above, over a suitable amount of time without limitation. Depending on the temperature used and the nature of the precursor species, the period of time may be, for example, at least 10, 20, 30, 60, 90, or 120 minutes and up to, for example, 180, 240, 360, 480, 600, 1200, 1500, or 1800 minutes.

After the conversion to the crystalline halide perovskite is complete in the annealing step, the ionic liquid can be conveniently removed from the perovskite film by rinsing the perovskite film with a solvent in which the ionic liquid is soluble. The solvent may be, for example, any of the non-ionic liquid solvents provided above. The residual solvent may then be removed by simple air drying or by inert gas flow (e.g., nitrogen), particularly in the case of low-boiling solvents (e.g., b.p. of up to 100° C.), and/or by application of a sufficiently elevated temperature as a post-annealing step, particularly for high-boiling solvents (e.g., b.p. over 100° C.). In another embodiment, the ionic liquid is removed by heating it at or near its boiling point for a suitable period of time. If desired, a vacuum may be applied to facilitate the removal of the ionic liquid or to employ a lower temperature for its removal.

In some embodiments, the perovskite film is also covered by a top layer of a solid material, such as a metal or metal oxide, in order to sandwich the perovskite film between two layers of material. The layers may serve to, for example, protect the perovskite film from oxidative degradation or provide a means of electrical conduction. In some embodiments, the substrate and/or top layer is electrically conductive or photoactive to work in concert with the perovskite film. The substrate and/or top layer may also be porous or include one or more windows to permit contact of a gas or liquid with the perovskite film, in the event the perovskite film is used as a photocatalyst or in a photoelectrochemical device.

The above-described crystalline perovskite films are useful in a variety of photoactive and related applications. The perovskite films can thus be integrated into any of a variety of devices directed to such applications. The perovskite films may be integrated into, for example, a photovoltaic device (e.g., solar cell or panel), light-emitting diode, photoluminescent device, laser, photodetector, x-ray detector, photocatalytic device, photoelectrochemical device, or thermoelectric device. The integration of such films into such devices is well known in the art.

Examples have been set forth below for the purpose of illustration and to describe the best mode of the invention at the present time. However, the scope of this invention is not to be in any way limited by the examples set forth herein.

EXAMPLES

Preparation of a Thin Film of $(CH_3NH_3)PbI_3$ Perovskite from Methylammonium Formate $(CH_3NH_3^+ HCOO^-)$ Ionic Liquid Methylammonium Formate $(CH_3NH_3^+HCOO^-)$ Synthesis To synthesize methylammonium formate ionic liquid, 25 mL of methylamine at 33% in ethanol and 10 mL absolute ethanol were added to a round bottom flask in an ice bath and placed under nitrogen flow on a Schlenk line. 6 mL of 88% formic acid was mixed with 25 mL of methanol and loaded into a 60 mL syringe. The formic acid solution was added dropwise to the methylamine solution using a syringe pump at a rate of 2-3 drops per second through a septum to maintain the seal in the round bottom flask. The reaction solution was stirred slowly during the addition of the formic acid solution. After the complete addition of the formic acid, the solution was stirred for an additional 1 hour, then the flask was placed under mild vacuum (~100 mTorr) for 24 hours. During the vacuum period, the ice bath was replenished periodically to maintain the temperature near 0° C. At the end of 24 hours, the temperature was raised to room temperature by removing the ice bath while maintaining vacuum; slow stirring was restored once the viscosity of the reaction product would allow for it. The reaction product was slowly stirred at room temperature for 60 minutes, at which point the solution was a clear viscous liquid.

Preparation of Methylammonium Iodide $(CH_3NH_3^+I^-)$ Organic Salt

Methylammonium iodide was prepared as previously published (Lee et al., *Science*, 2012, 338, 643-647) and stored in a desiccator.

Substrate Preparation

Silicon or glass substrates were cleaned by sequential sonication in acetone and then isopropyl alcohol (IPA) for 5 minutes followed by rinsing with IPA and deionized (DI) water, followed by UV-ozone (UVO) cleaning for 5 minutes. Directly prior to spin-coating, the substrates were rinsed with IPA and DI water, dried under nitrogen flow, and cleaned with UVO for 1-2 minutes.

Precursor Film Preparation

A 30 wt % solution of $PbI_2$ and methylammonium iodide in a 1:1 molar ratio was prepared in air by dissolving the two components in methylammonium formate ionic liquid and stirring at low speed overnight. Spin-cast films were made by depositing ~40 µL of the 30 wt % solution and spinning at 2000 rpm for 30 seconds. Drag-coated films were made by depositing 3-5 µL of 30 wt % solution on a substrate, then doctor blading, by hand, with a razor blade; film thickness was controlled by using Kapton tape of various thicknesses to control the blade height. Generally, the film thickness was approximately in the range of 500-700 nm.

Annealing of the Precursor Film to Produce a Crystalline Film of $(CH_3NH_3)PbI_3$ Upon completion of the deposition, the substrates coated with precursor films were immediately placed on a preheated stage at the annealing temperature. After annealing, the films were allowed to cool for several minutes, and residual methylammonium formate ionic liquid was removed by submersion of the film in butanol for two minutes followed by rinsing with freshly dried butanol. After rinsing, residual butanol was removed by nitrogen flow followed by heating on a hot plate at 130° C. for 30 seconds. Note: the films used for in situ WAXS characterization did not undergo the rinsing step as the data was collected during film formation. As verified by XRD, SEM and UV-Vis absorption before and after the rinse, no changes were observed in the films due to the rinsing step.

Characterization of the Perovskite Film

Figure 1B:
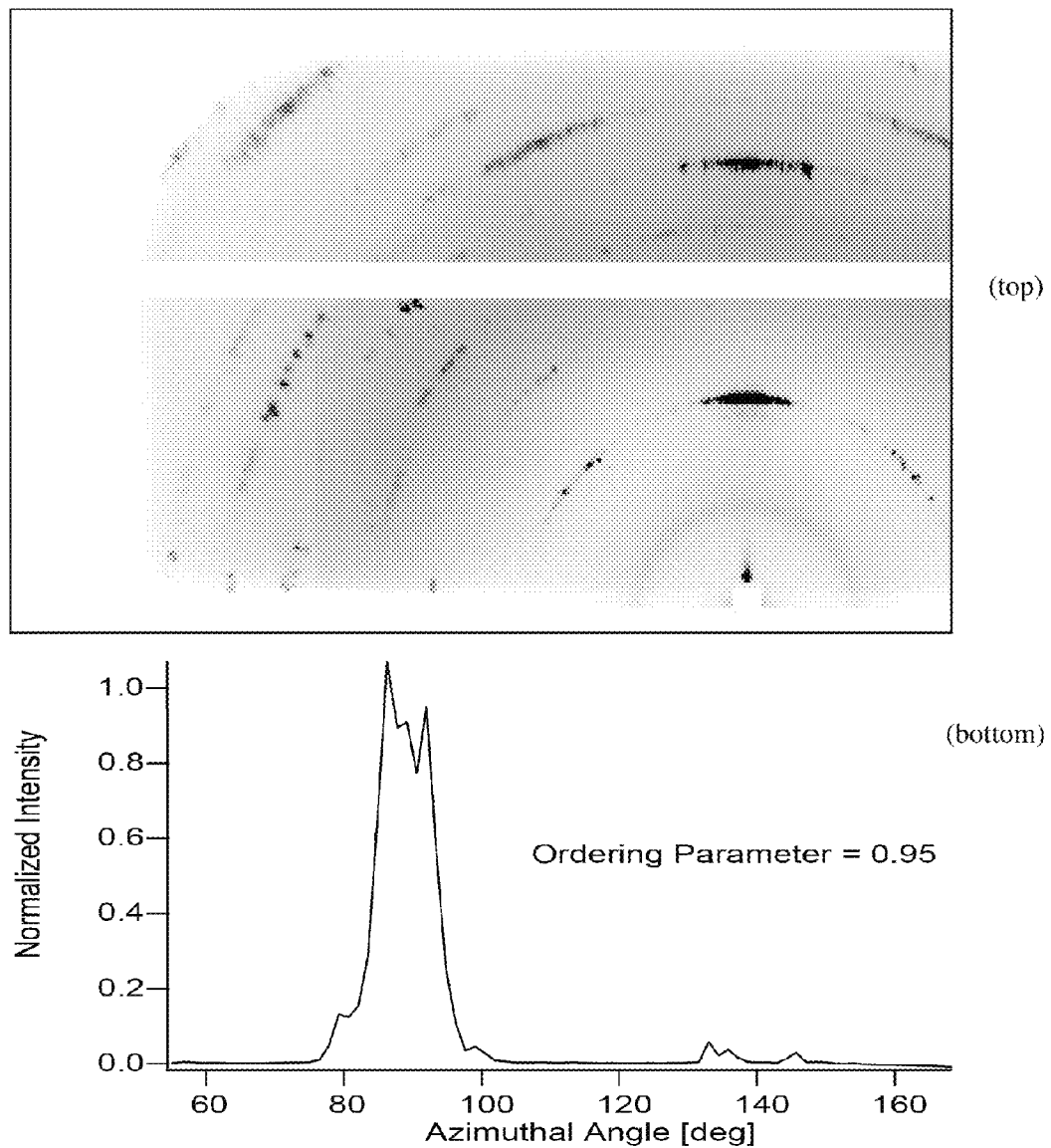

The evolution of the crystal growth was determined by in situ synchrotron wide angle X-ray scattering (WAXS) during the annealing process. FIG. 1A shows integrated 1D scattering plots after a completed 10 minute heating cycle at 50° C. under nitrogen. The trace at 6 minutes shows the first indication of a crystalline structure with the first peak appearing at $q=10$ nm$^{-1}$, the known location of the (110) peak of $(CH_3NH_3)PbI_3$. On the timescale of the X-ray experiments, no crystalline intermediate was detected, which suggests a direct (one-step) route to thin-film crystallization of $(CH_3NH_3)PbI_3$. The lack of an intermediate composition leads to better control of the desired perovskite film since the starting materials and conditions for the process are now known. Moreover, as evident from the 2D WAXS image of the same film taken at $t=10$ minutes in FIG. 1B (top), the crystal grains possess a high degree of orientation, which has been correlated to improved device performance (Saliba et al., *J. Phys. Chem. C*, 2014, 118, 17171-17177). FIG. 1B (bottom) shows the azimuthally integrated 1D plot of the (110) reflection after background subtraction from which an ordering parameter of 0.95 is calculated.

Figure 2A:
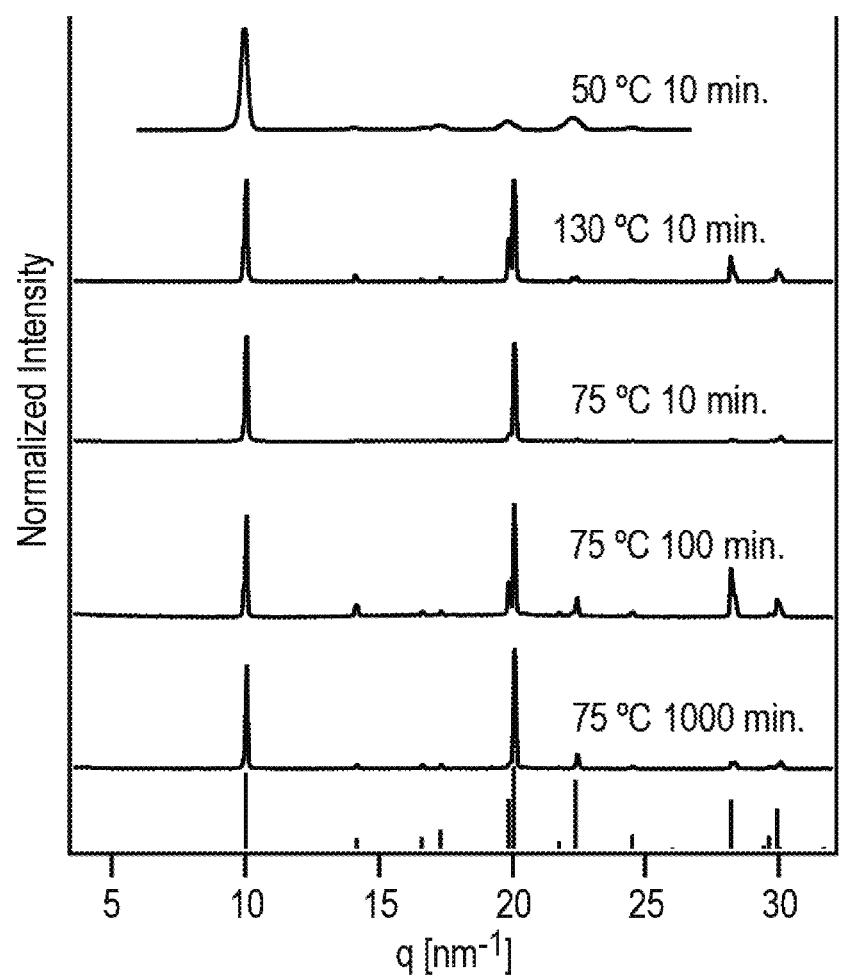
FIGS. 2A, 2B.

In further experiments, several different films were prepared and subjected to a variety of substantially different post-deposition annealing protocols. FIG. 2A shows the XRD scans for three different temperature protocols: 10 minutes at 50° C., 75° C., and 130° C., plus results for longer annealing times of 100 and 1000 minutes (~16 hours) at 75° C. Including the sample from FIGS. 1A and 1B, temperature extremes of 50-130° C. for 10 minutes and time extremes of 10-1000 minutes at 75° C. were successfully employed. As the data in FIG. 2A demonstrates, in all cases, the resulting film is composed of crystalline $(CH_3NH_3)PbI_3$. Most notably, none of the samples indicate either an intermediate or decomposition to $PbI_2$. The XRD plots show differences in the peak ratios for the different samples, which indicate different textures. The cause, and the evolution, of the texture is not completely clear at this time. In previous work (Tan et al., *ACS Nano*, 2014, 8, 4730-4739), the maximum amount of time available for annealing a film, before the onset of decomposition, was approximately 50% longer than the time required for complete perovskite crystallization. The results for the 75° C. sample show that complete crystallization can occur in as little as 10 minutes, and yet no decomposition is evident after 16 hours. The overall effect is clear: processing times two orders of magnitude longer than those required for complete crystallization can be employed with no detectable decomposition.

Figure 2B:
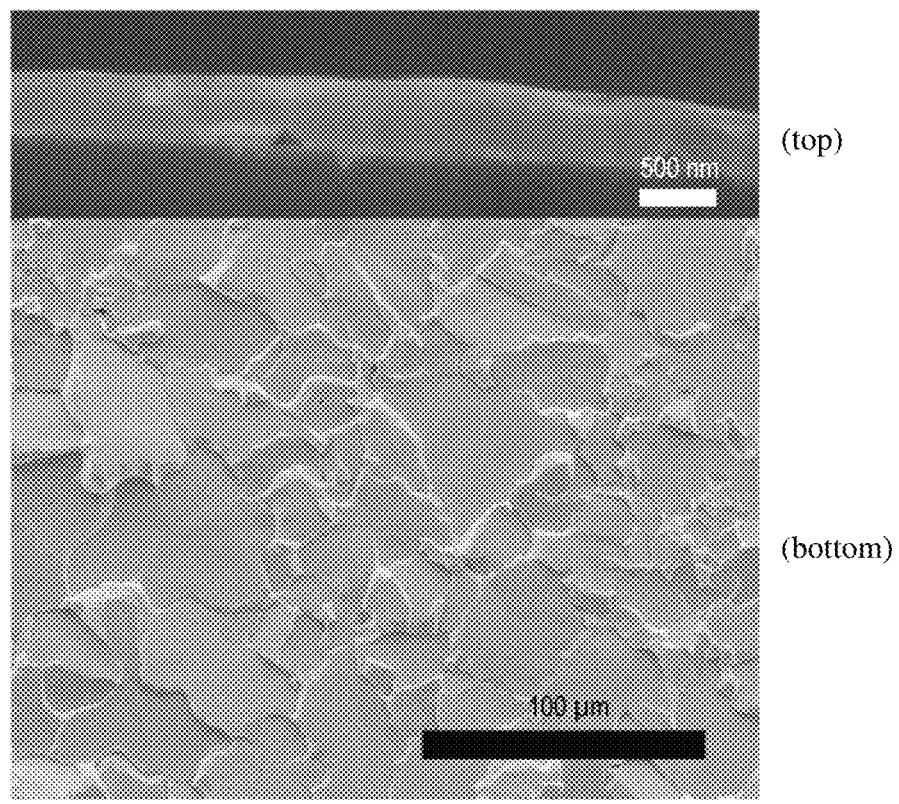

The success at bypassing a crystalline intermediate and decoupling the crystallization time from the temperature is of most value if it maintains or surpasses the level of film quality that has already been achieved by other methods. FIG. 2B shows SEM plan and cross-section views of a film cast from methylammonium formate and annealed at 75° C. for 16 hours. The film quality is impressive, with complete coverage of the substrate, consistent film thickness, and large domains on the order of tens of micrometers.

Figure 1C:
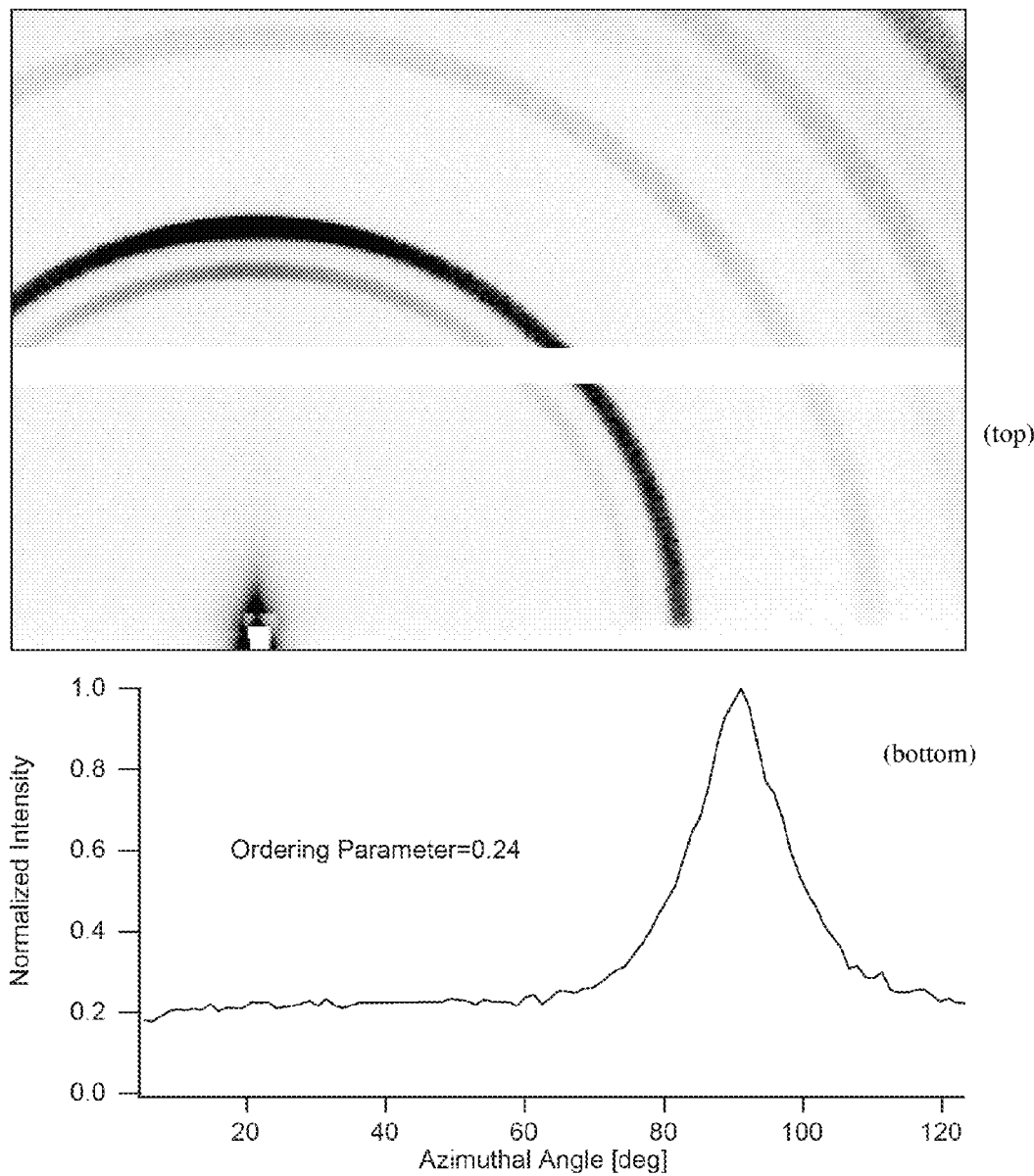
Figure 2C:
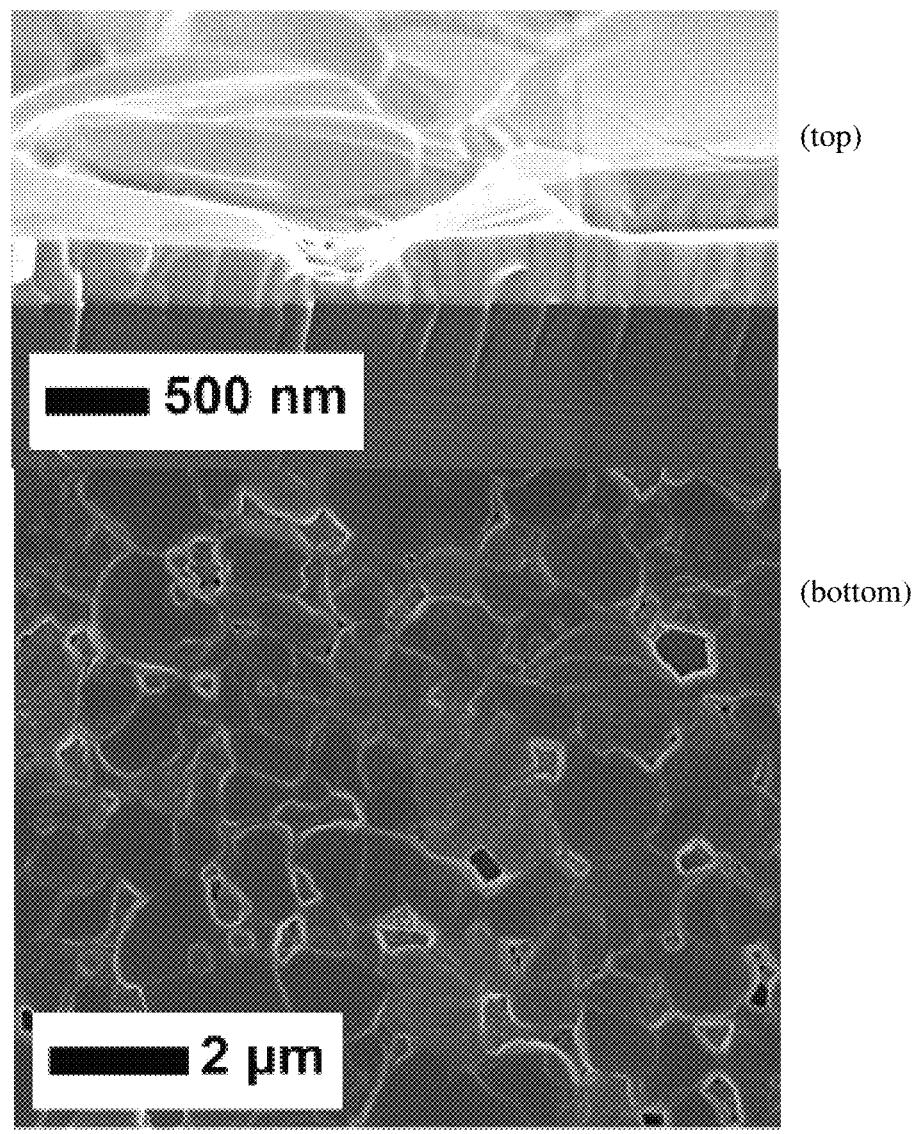
FIG. 2C: Analogous to FIG. 2B except film was cast from dimethylformamide and annealed at 100° C., included for reference; cross-section (top) and plan (bottom) views.

Reference films shown in FIGS. 1C and 2C were prepared as above with the following exceptions: (a) solvent was dimethylformamide, (b) spin time was 60 seconds, and (c) annealing was conducted at 100° C. for 45 minutes followed by 130° C. for 5 minutes. FIG. 1C is analogous to FIG. 1B except the film was cast from dimethylformamide (DMF) solvent for reference: 2D WAXS image showing lack of film texture (top) and 1D plot showing the calculated ordering parameter of 0.24 (bottom). FIG. 1C (top) shows a powder-like diffraction pattern with very little texture. FIG. 1C (bottom) indicates a very low ordering parameter. FIG. 2C is analogous to FIG. 2B except film was cast from dimethylformamide and annealed at 100° C., included for reference; cross-section (top) and plan (bottom) views. FIG. 2C shows the surface roughness (top), approximately 1 micrometer grain sizes (bottom), and small pinholes in the film, all of which are typical of films cast from VOC solvents.

In conclusion, using methylammonium formate as a representative ionic liquid, the above results demonstrate an improved process for producing high-quality crystalline thin films of $(CH_3NH_3)PbI_3$ without an intermediate phase or perovskite decomposition over a broad range of annealing temperatures and processing times. The process results in films with superior coverage, uniformity, and large crystal domains that are highly oriented. The absence of an intermediate also permits the application of well-known solution-based methods for controlling both nucleation and growth.

While there have been shown and described what are at present considered the preferred embodiments of the invention, those skilled in the art may make various changes and modifications which remain within the scope of the invention defined by the appended claims.

What is claimed is:

1. A film comprising a crystalline halide perovskite composition having the following formula:

$$AMX_3 \tag{1}$$

wherein:
A is an organic cation selected from the group consisting of methylammonium, tetramethylammonium, formamidinium, and guanidinium;
M is at least one divalent metal; and
X is independently selected from halide atoms;
wherein the crystalline film of the halide perovskite composition possesses at least one of an average grain size of at least 30 microns, substantial crystal orientation evidenced in an ordering parameter of at least 0.6, and a level of crystallinity of at least 90%.

2. The film of claim 1, wherein the film of the crystalline halide perovskite composition possesses an average grain size of at least 30 microns.

3. The film of claim 1, wherein the film of the crystalline halide perovskite composition possesses an average grain size of at least 50 microns.

4. The film of claim 1, wherein the film of the crystalline halide perovskite composition possesses an average grain size of at least 100 microns.

5. The film of claim 1, wherein the at least one divalent metal is selected from lead, tin, and germanium.

6. The film of claim 1, wherein the film has a thickness of at least 200 nm.

7. A method for producing a film of a crystalline halide perovskite composition, the method comprising:
i) forming a film of a perovskite precursor solution onto a substrate, the perovskite precursor solution comprising a) a metal-containing compound of the formula $MX'_2$, where M is at least one divalent metal and X' is a monovalent anion; b) an organic salt of the formula AX, wherein A is selected from methylammonium, tetramethylammonium, formamidinium, and guanidinium, and X is independently selected from halide atoms; and c) an ionic liquid; wherein components a) and b) are dissolved in component c); and
ii) annealing the film of the perovskite precursor solution at a temperature of at least 30° C. for a time period effective to convert perovskite precursor components in the perovskite precursor solution to a film of a crystalline halide perovskite composition having the following formula:

$$AMX_3 \tag{1}$$

wherein A, M, and X are as defined above; and
wherein the crystalline film of the halide perovskite composition possesses at least one of an average grain size of at least 30 microns, substantial crystal orientation evidenced in an ordering parameter of at least 0.6, and a level of crystallinity of at least 90%.

8. The method of claim 7, wherein the at least one divalent metal (M) is selected from lead, tin, and germanium.

9. The method of claim 7, wherein the film of the crystalline halide perovskite composition has a thickness of at least 200 nm.

10. The method of claim 7, wherein the ionic liquid is selected from the group consisting of an alkylammonium ionic liquid, formamidinium ionic liquid, and guanidinium ionic liquid.

11. The method of claim 7, wherein the ionic liquid possesses a cation that is equivalent to the cation A in the organic salt.

12. The method of claim 7, wherein the ionic liquid possesses an anion other than halide.

13. The method of claim 7, wherein the ionic liquid possesses a carbon-containing anion.

14. The method of claim 7, wherein $MX'_2$ and AX in the precursor are present in a relative amount such that the ratio of M:X is about 1:3.

15. The method of claim 7, wherein a temperature of at least 30° C. and up to 150° C. is used in the annealing step (ii).

16. The method of claim 7, wherein the film of the crystalline halide perovskite composition possesses an average grain size of at least 30 microns.

17. The method of claim 7, wherein the film of the crystalline halide perovskite composition possesses an average grain size of at least 50 microns.

18. The method of claim 7, wherein the film of the crystalline halide perovskite composition possesses an average grain size of at least 100 microns.

19. The method of claim 7, further comprising removing the ionic liquid by rinsing said film of the crystalline halide perovskite composition with a solvent in which the ionic liquid is soluble.

* * * * *